(12) United States Patent
Wu

(10) Patent No.: US 6,605,506 B2
(45) Date of Patent: Aug. 12, 2003

(54) METHOD OF FABRICATING A SCALABLE STACKED-GATE FLASH MEMORY DEVICE AND ITS HIGH-DENSITY MEMORY ARRAYS

(75) Inventor: Ching-Yuan Wu, Hsinchu (TW)

(73) Assignee: Silicon-Based Technology Corp., Hsinchu (TW)

( * ) Notice: Subject to any disclaimer, the term of this patent is extended or adjusted under 35 U.S.C. 154(b) by 363 days.

(21) Appl. No.: 09/771,731

(22) Filed: Jan. 29, 2001

(65) Prior Publication Data

US 2002/0102793 A1 Aug. 1, 2002

(51) Int. Cl.[7] .................. H01L 21/336; H01L 21/3205

(52) U.S. Cl. .................. 438/257; 438/258; 438/266; 438/296; 438/593

(58) Field of Search .................. 438/257, 258, 438/259, 266, 593, 585, 586, 587, 589, 294, 296

(56) References Cited

U.S. PATENT DOCUMENTS

| | | | | |
|---|---|---|---|---|
| 5,516,721 A | * | 5/1996 | Galli et al. .................. | 257/510 |
| 5,767,005 A | * | 6/1998 | Doan et al. .................. | 438/258 |
| 5,770,501 A | * | 6/1998 | Hong .................. | 438/264 |
| 5,966,615 A | * | 10/1999 | Fazan et al. .................. | 438/424 |
| 6,034,393 A | * | 3/2000 | Sakamoto et al. .................. | 257/315 |
| 6,140,182 A | * | 10/2000 | Chen .................. | 438/259 |
| 6,153,472 A | * | 11/2000 | Ding et al. .................. | 438/264 |
| 6,171,909 B1 | * | 1/2001 | Ding et al. .................. | 438/267 |
| 6,177,317 B1 | * | 1/2001 | Huang et al. .................. | 438/263 |
| 6,214,667 B1 | * | 4/2001 | Ding et al. .................. | 438/257 |
| 6,222,225 B1 | * | 4/2001 | Nakamura et al. .................. | 257/315 |
| 6,235,589 B1 | * | 5/2001 | Meguro .................. | 438/267 |
| 6,323,085 B1 | * | 11/2001 | Sandhu et al. .................. | 438/201 |

OTHER PUBLICATIONS

Takeuchi et al., "A Self–Aligned STI Process Integration for Low Cost and Highly Reliable 1Gbit Flash Memories", 1998 Syposium on VLSI Technology, Digest of Technical Papers, pp. 102–103, Jun. 9–11, 1998.*

Imamiya et al., "A 130–mm$^2$, 256–Mbit NAND Flash with Shallow Trench Isolation Technology", IEEE Journal of Solid–State Circuits, pp. 1536–1543, Feb. 1999.*

* cited by examiner

Primary Examiner—Matthew Smith
Assistant Examiner—Lex H. Malsawma
(74) Attorney, Agent, or Firm—Stroock & Stroock & Lavan LLP

(57) ABSTRACT

A scalable stacked-gate flash memory device and its high-density memory arrays are disclosed by this invention. There are four different spacer techniques used to fabricate a scalable stacked-gate flash memory device: the first spacer technique is used to form the buffer-oxide spacers for implanting the channel stops of shallow-trench-isolation and oxidizing the etched surface of shallow trenches without sacrificing the active width of non-volatile semiconductor memory devices; the second spacer technique is used to highly adjust the coupling ratio of the self-aligned floating gate using a shallow-trench-isolation (STI) structure so that the applied control-gate voltage for programming and erase can be reduced; the third spacer technique is used to define the gate length of a scalable stacked-gate structure; and the fourth spacer technique is used to form the sidewall spacers for self-aligned source/drain implant, self-aligned source/drain or common buried-source silicidation, and self-aligned contacts. The scalable in here means the gate length of a stacked-gate flash memory device can be adjustable to be much smaller than the minimum feature size of technology used and high-density stacked-gate flash memory device arrays using NOR and NAND architectures are obtained. As a consequence, the scalable stacked-gate flash memory device of the present invention can be used to implement high-density, high-speed, low voltage and low-power flash memory array and system for mass storage applications.

32 Claims, 10 Drawing Sheets

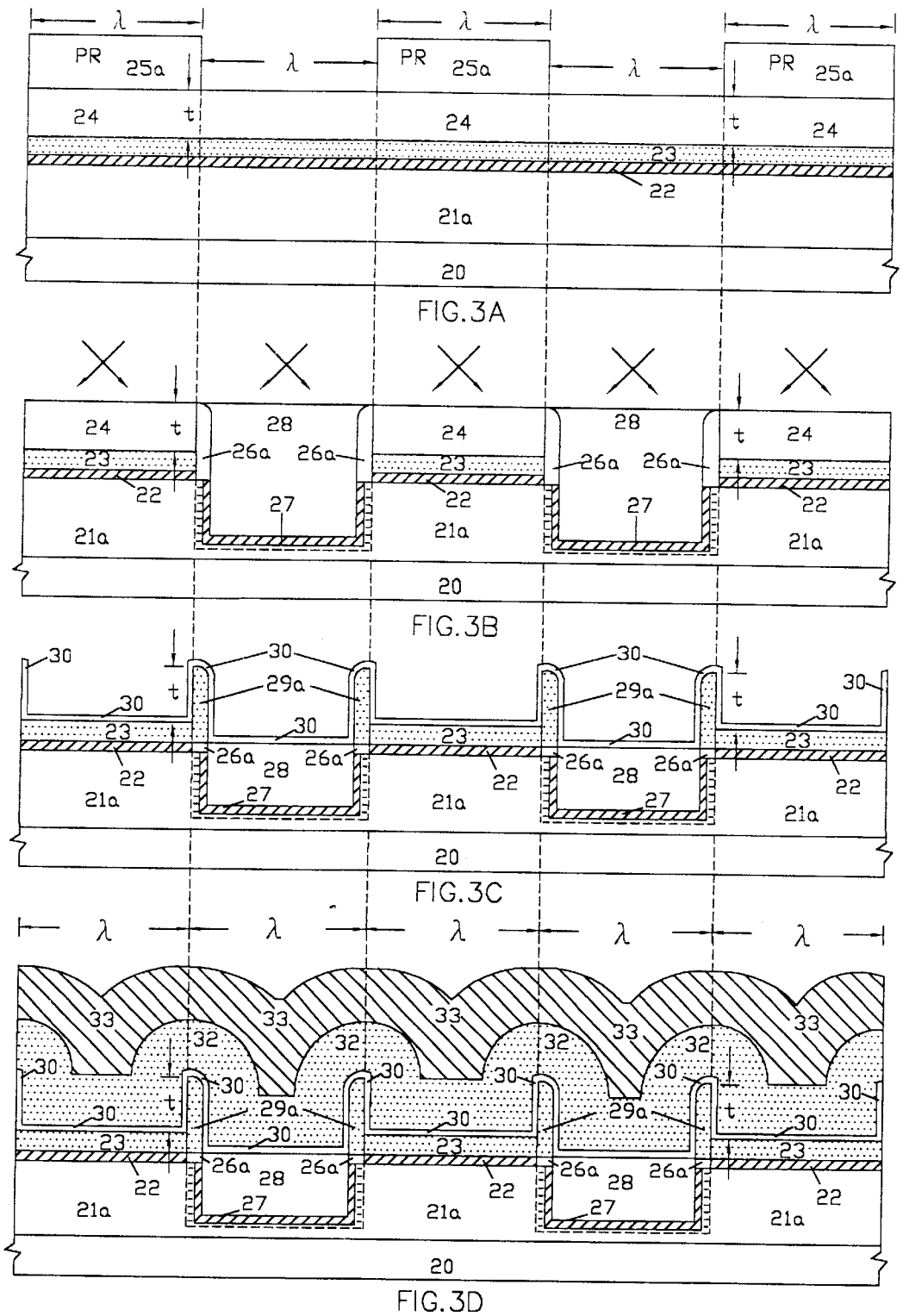

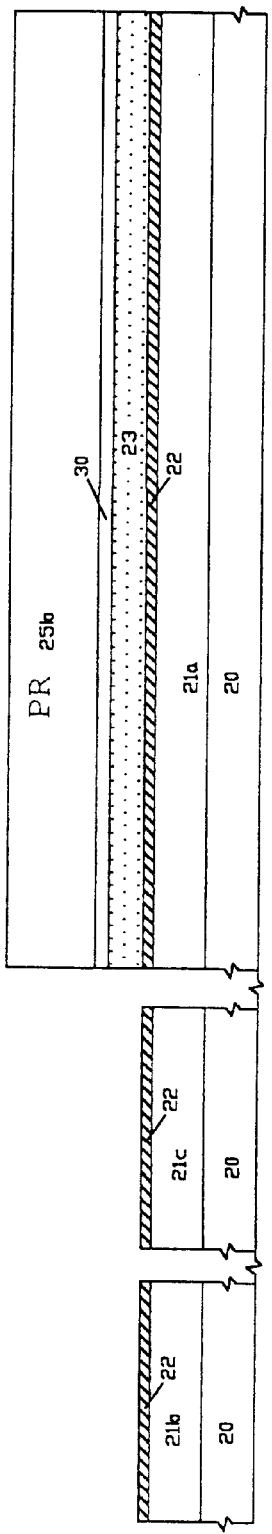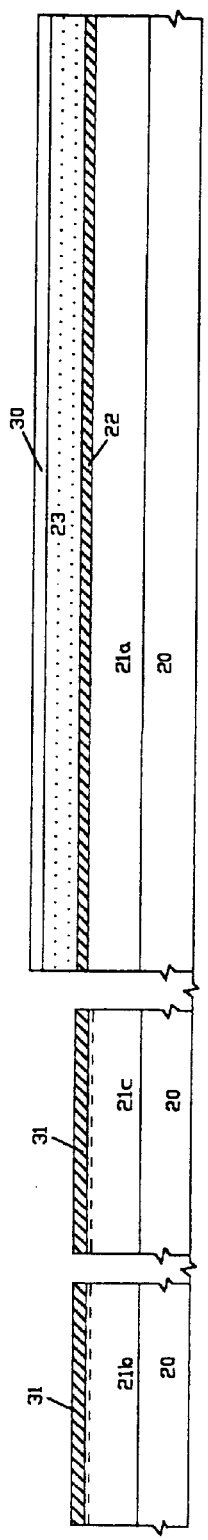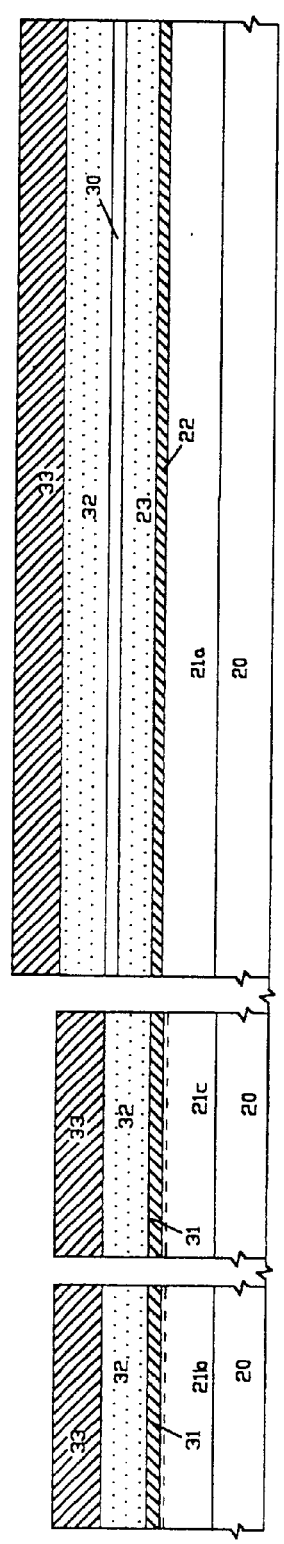

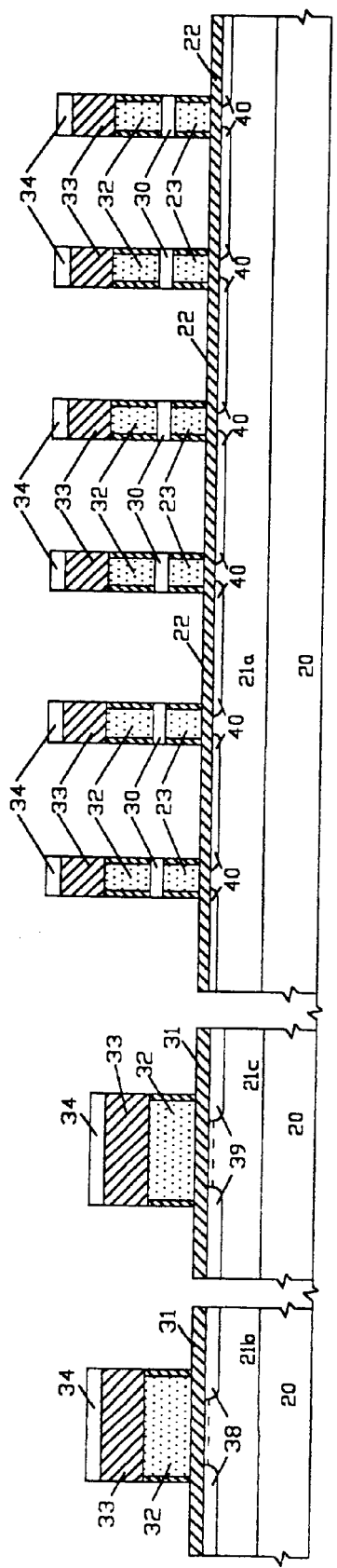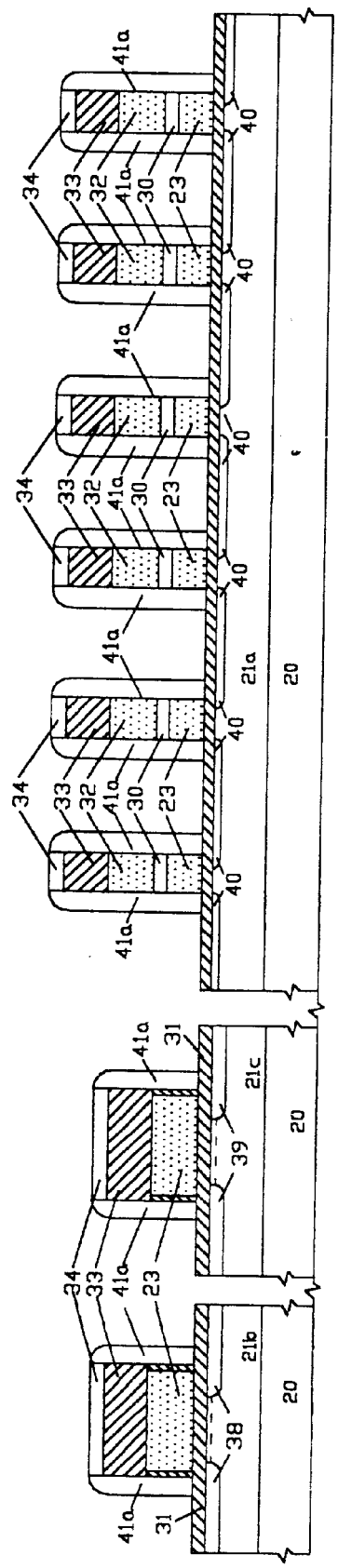

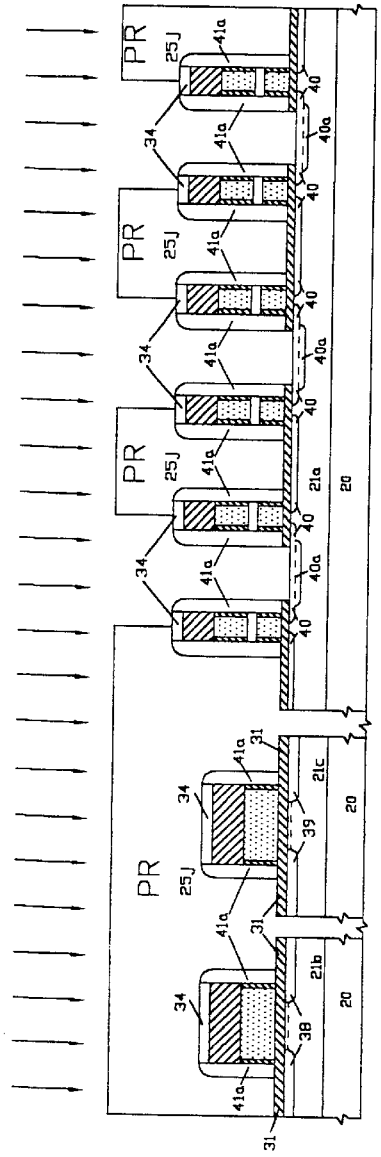
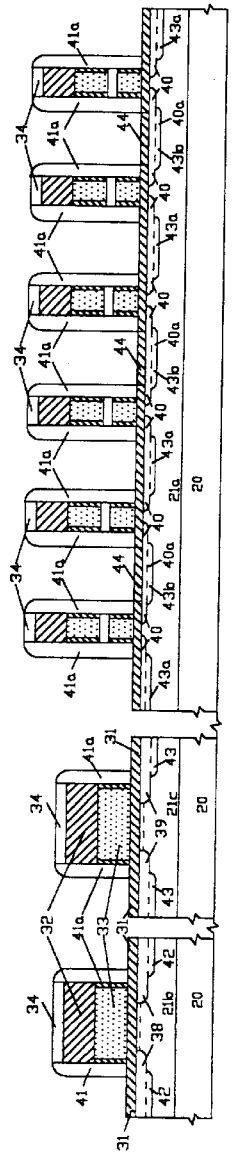
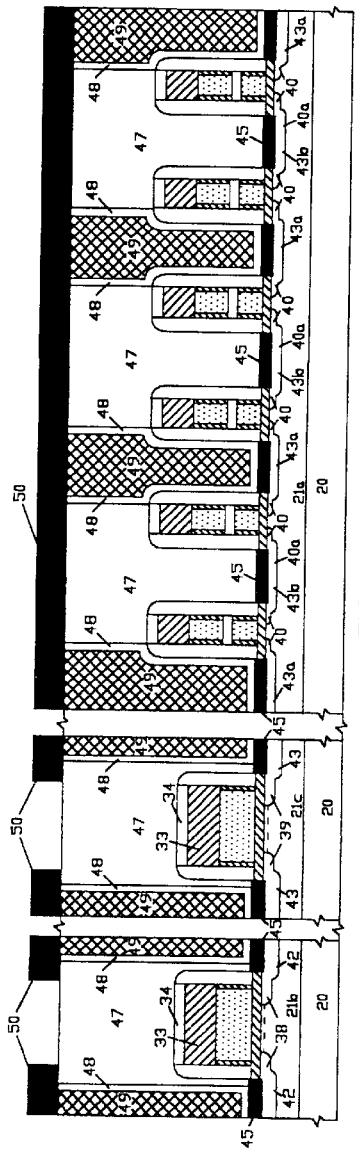
FIG.5A
FIG.5B
FIG.5C

METHOD OF FABRICATING A SCALABLE STACKED-GATE FLASH MEMORY DEVICE AND ITS HIGH-DENSITY MEMORY ARRAYS

BACKGROUND OF THE INVENTION

1. Field of the Invention

The invention relates generally to flash memory devices and more particularly to very high-density, high-speed, low-voltage and low-power stacked-gate flash memory device and its memory arrays.

2. Description of Related Art

The flash memory devices are known to store charges in an isolated gate (known as the floating gate) by means of either Fowler-Nordheim tunneling or hot-carrier injection through a thin insulator layer from the semiconductor substrate and to remove or erase charges stored in an isolated gate by means of Fowler-Nordheim tunneling through a thin insulator layer to the semiconductor substrate or the control gate. Basically, the cell size must be scaled down for high-density mass storage applications and the device structure must be developed toward low-voltage, low-current and high-speed operation with high endurance and high retention.

A typical stacked-gate flash memory device in a conventional flash memory array is shown in FIG. 1, where FIG. 1A shows the schematic cross-sectional view in the channel-length direction; FIG. 1B shows the schematic cross-sectional view in the channel width direction; FIG. 1C shows the top-plan view of a NOR-type configuration. The stacked-gate flash memory device shown in FIG. 1A includes a p-type semiconductor substrate 100 and a p-well 101 formed in the p-type semiconductor substrate. A thin tunneling-oxide layer 102 is provided on the surface of a p-well 101 having a thickness of approximately 100 Angstroms. A polycrystalline-silicon layer 103 acted as the floating gate is provided on a thin tunneling-oxide layer 102 and an inter-gate dielectric layer 104 using the silicon oxide-silicon nitride-silicon oxide (ONO) structure separates the floating gate 103 and the control gate 105. The control gate 105 can be a heavily-doped polycrystalline-silicon or a heavily-doped polycrystalline-silicon layer capped by a silicide layer. The source diffusion regions 106 and the drain diffusion regions 107 are formed in a self-aligned manner. The source diffusion regions 106 can be the heavily-doped $n^+$ regions and the drain diffusion regions 107 can be the double-diffused structure having the lightly-doped $n^-$ regions in the heavily-doped $n^+$ region to reduce the band-to-band tunneling effects during erase.

It is clearly seen from FIG. 1A that the gate length of a stacked-gate structure is mainly limited by the minimum feature size ($\lambda$) of technology used and the minimum feature size ($\lambda$) is mainly limited by the photo-lithographic technology. However, the spacing ($\lambda'$) between devices is in general larger than the minimum feature size ($\lambda$), i.e., $\lambda'=\lambda+2\Delta\lambda'$, for contact implementation. Therefore, the effective length per cell is about $2\lambda(1+\Delta\lambda'/\lambda)>2\lambda$. Moreover, the applied source voltage with respect to the drain (in general grounded) for hot-electron generation during programming can be reduced only when the gate length $\lambda$ is reduced and the applied control-gate voltage for programming can be reduced by only increasing the coupling ratio of the floating gate. Similarly, the coupling ratio of the floating gate plays a major role on the reduction of applied voltage for erasing the stored charges in the floating gate to either the p-well or the control gate.

The coupling ratio of a stacked-gate flash memory device can be improved by the isolation structure in the channel-width direction. FIG. 1B shows a typical shallow-trench-isolation (STI) technique for high-density stacked-gate flash memory array in the channel-width direction, where the etched monocrystalline-silicon trenches in the p-well 101 are oxidized to form thin thermal silicon-oxide layers 108 before the filling silicon-oxide layers 109 are formed. The floating gate 103 is defined photolithographically to extend $\Delta\lambda''$ over the isolation regions in order to increase the coupling ratio of the floating gate. Apparently, the width of isolation $\lambda''$ must be equal to or larger than $\lambda+2\Delta\lambda''$, i.e., $\lambda'' \geq \lambda+2\lambda''$, the effective width per cell is then about $2(\lambda+\Delta\lambda'')$. For NOR-type configuration, the effective area per cell is then about $4\lambda^2(1+\Delta\lambda''/\lambda)(1+\Delta\lambda'/\lambda)$, as shown in FIG. 1C. Moreover, the photolithographic misalignment tolerance of the floating gate may produce different coupling ratios from wafer to wafer and asymmetric device isolation phenomena. It is clearly visualized that the coupling ratio of the floating gate shown in FIG. 1B is increased by sacrificing the effective cell area. From the paper published by K. Imamiya et al., "A 130-$\mu$m$^2$, 256-Mbit NAND Flash with Shallow Trench Isolation Technology", IEEE Jour. of Solid-State Circuits, Vol. 34, NO. 11, pp. 1536–1541, Nov. 1999, the non-self-aligned floating gate is composed of two polycrystalline-silicon layers, $\lambda=0.25$ $\mu$m, $\Delta\lambda''=0.1\lambda=0.025$ $\mu$m, $\Delta\lambda'=0.03375$ $\mu$m and apparently asymmetric $\Delta\lambda''$ for memory cell due to photolithographic misalignment error can be seen from a photograph of their publication. If $\Delta\lambda''=0$ for self-aligned floating gate, the effective area per cell can be reduced by 10% and the misalignment of the floating gate can be automatically eliminated.

There are several U.S. patents concerning the implementation of a self-aligned floating gate having higher coupling ratio. U.S. Pat. No. 6,140,182 described a silicon-nitride masking to remove the floating-gate polycrystalline-silicon layer over the isolation regions for both LOCOS and shallow trench isolations. There are two major disadvantages: one is the removal of pad-oxide over the active regions after forming the planarized isolation-oxides using shallow-trench-isolation; the other is the removals of the masking silicon-nitride layer over the polycrystalline-silicon layer and the polycrystalline-silicon layer over the isolation oxides. The removal of pad-oxide after forming the isolation oxides may cause the variations of the height of isolation oxides, which will change (reduce) the coupling ratio in certain errors. Besides, the active device surface and the upper corner will be etched if an anisotropic etching is used, resulting in poor surface for growing the thin tunneling-oxide layer; or both the bottom and upper corners of isolation-oxide edges will be etched if wet chemical is used, resulting in the etching holes at the bottom corners of the isolation oxides for over-etching and non-uniform thickness of the thin tunneling-oxide for under-etching. Similarly, the removals of the capped silicon-nitride layer and the polycrystalline-silicon layer over the isolation oxides may produce the errors for the height of extended side-wall floating gate. Moreover, the irregular shape of tips of etched polycrystalline-silicon floating gate may cause the stored-charge retention and disturb problems due to field emission. In addition, no channel stops are performed for shallow-trench-isolation to eliminate the surface leakage current. U.S. Pat. No. 5,770,501 used liquid-phase deposition (LPD) to form isolation-oxides within the slots of the patterned photoresist, as described by U.S. Pat. No. 5,516,721. It is quite apparent that the etched surface of the shallow trenches is impossible to grow the thermal oxides in order to eliminate the defects produced by trench etching; moreover, the height of LPD oxide is difficult to be controlled, which determines the coupling ratio of the self-aligned floating gate. The major disadvantages appeared in U.S. Pat. No. 5,516,721 was revised by U.S. Pat. No. 6,153,472 in which the polycrystalline-silicon spacers are formed on the sidewalls of the planarized filling oxides and the etched trench surface of shallow-trench-isolation and the sidewalls of etched major floating-gate polycrystalline-silicon layer are oxidized. It is clearly seen that the oxidized process may largely increase the thickness of the tunneling-oxide layer near the edges through the bird's beak effects and the effective active width of so called flash memory devices will be reduced. Moreover, no channel stops are performed for shallow-trench-isolation.

From the above descriptions, the self-aligned floating gate is required in order to reduce the isolation area and higher coupling ratio of the self-aligned floating gate is important to increase the program and erase efficiency of applied control-gate voltage. Moreover, if the minimum feature size $\lambda$ can be removed from defining the gate length of stacked-gate flash memory device, the cell size and the applied source/drain voltage can be further reduced.

It is therefore an objective of this invention to provide a method of fabricating a scalable stacked-gate flash memory device having highly adjustable coupling ratio for high-density, high-speed, low-voltage and low-power mass storage applications to overcome the disadvantages of the prior arts.

SUMMARY OF THE INVENTION

The invention discloses in general a method of fabricating a scalable stacked-gate flash memory device and its high-density memory arrays using four different spacer techniques. The first spacer technique of the present invention is used to form the buffer-oxide spacers for implanting the channel stops of shallow-trench-isolation and oxidizing the etched surface of shallow trenches without sacrificing the active width of non-volatile semiconductor memory devices and the second spacer technique is used to highly adjust the coupling ratio of the self-aligned floating gate using shallow-trench-isolation, where the first polycrystalline-silicon spacers are formed on the sidewalls of the etched first masking silicon-nitride layer and the etched first polycrystalline-silicon layer after etching the planarized filling isolation oxides having an adjustable thickness t of the first masking silicon-nitride layer plus the thickness of the first polycrystalline-silicon layer. The first masking silicon-nitride layers are removed in a self-aligned manner and the dielectric layer is then formed on the patterned first polycrystalline-silicon layer, the formed first polycrystalline-silicon spacers and the etched filling isolation-oxides. The first dielectric layer can be a composite layer of silicon oxide-silicon nitride-silicon oxide (ONO) layer. A second polycrystalline-silicon layer and then a silicide layer are deposited to form the control gate. It is clearly seen that the coupling ratio of the self-aligned floating gate of the present invention is much increased as compared to that of the prior arts and the effective active layer width $\lambda$ is not affected by forming the channel stops of shallow-trench-isolation and oxidizing the surface of the etched trenches. Therefore, the effective active layer width per cell is only $2\lambda$, where $\lambda$ is the minimum-feature-size of technology used. The third spacer technique of the present invention uses the second silicon-oxide spacers formed on the sidewalls of the patterned and etched first masking polycrystalline-silicon layer to define the gate length $\Delta L$ of stacked-gate flash memory devices and the second masking silicon-nitride layer is etched and is used as a hard mask to etch the silicide layer, the second polycrystalline-silicon layer, the first dielectric layer, the first polycrystalline-silicon spacers, and the first polycrystalline-silicon layer. The thermal oxidation is performed to grow thin first poly-oxide layers on the sidewalls of the etched first polycrystalline-silicon layer, the etched first polycrystalline-silicon spacer and the etched second polycrystalline-silicon layer. The implantation of arsenic impurities across the first thermal-oxide layer is performed in a self-aligned manner to form the mid-doped source/drain diffusion regions of stacked-gate flash memory devices. The fourth spacer technique of the present invention is performed to form the thin silicon-nitride spacers on the sidewalls of the stacked-gate structure for self-aligned heavily-doped source/drain implant, self-aligned source/drain or common buried-source silicidation, and self-aligned contacts. It is clearly seen that the effective length per cell is only $\lambda(1+\Delta L/\lambda)$, which is much smaller than that of the prior arts in which the gate length of stacked-gate flash memory devices is based on the minimum feature size of technology used. For a NOR-type configuration with common buried-source, the effective cell size is only $2\lambda^2(1+\Delta L/\lambda)$. It is clearly understood that $\Delta L<\lambda$ can be easily implemented using existing spacer formation technique and the effective cell size can be made to be smaller than $4\lambda^2$(for $\Delta L=\lambda$) and is adjustable through the width of the spacer $\Delta L$. Moreover, since the gate length is smaller than the minimum feature size of technology used, the applied source-drain voltage for programming can be reduced and the applied control-gate voltage can be reduced accordingly due to the very high coupling ratio of the self-aligned floating gate of the present invention. Similarly, the applied erasing voltage across the control gate and the substrate can be also reduced. As consequence, a method of fabricating the scalable stacked-gate flash memory device of the present invention can be used to implement high-density, high-speed, low-voltage and low-power flash memory array and system for mass storage applications.

BRIEF DESCRIPTION OF THE DRAWINGS

FIGS. 3A through 3D show the schematic cross-section views of the process and structure of shallow-trench-isolation used for the width of stacked-gate flash memory device array of the present invention;

FIGS. 4A through 4H show the schematic cross-section views of the process and structure of the present invention for simultaneously fabricating scalable stacked-gate flash memory device array and peripheral CMOS devices;

FIGS. 5A through 5C show the schematic cross-section views of the process and structure of the present invention for simultaneously fabricating scalable stacked-gate flash memory device array of a NOR-type architecture and peripheral CMOS devices following FIG. 4.

DETAILED DESCRIPTION OF THE PREFERRED EMBODIMENTS

Figure 1A:
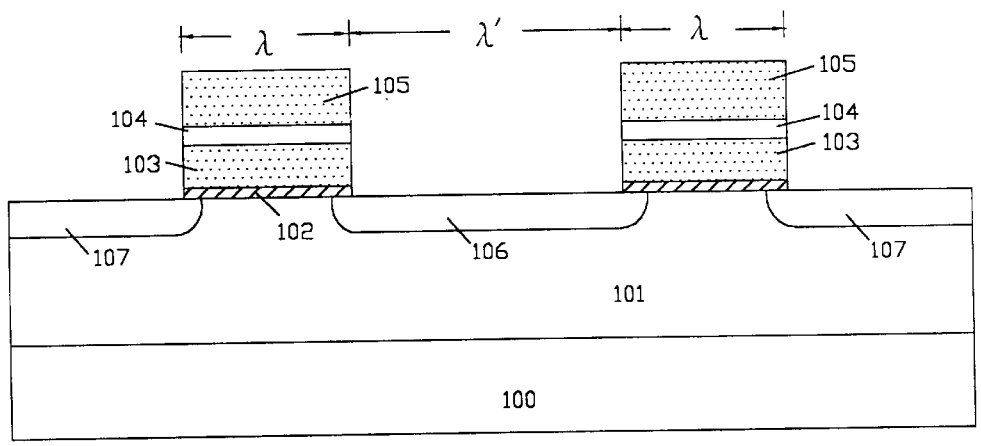
FIGS. 1A through 1C show the partial cross-sectional views of a conventional stacked-gate flash memory device array in the channel-length and channel-width directions and the partial top-plan view, respectively.
Figure 1B:
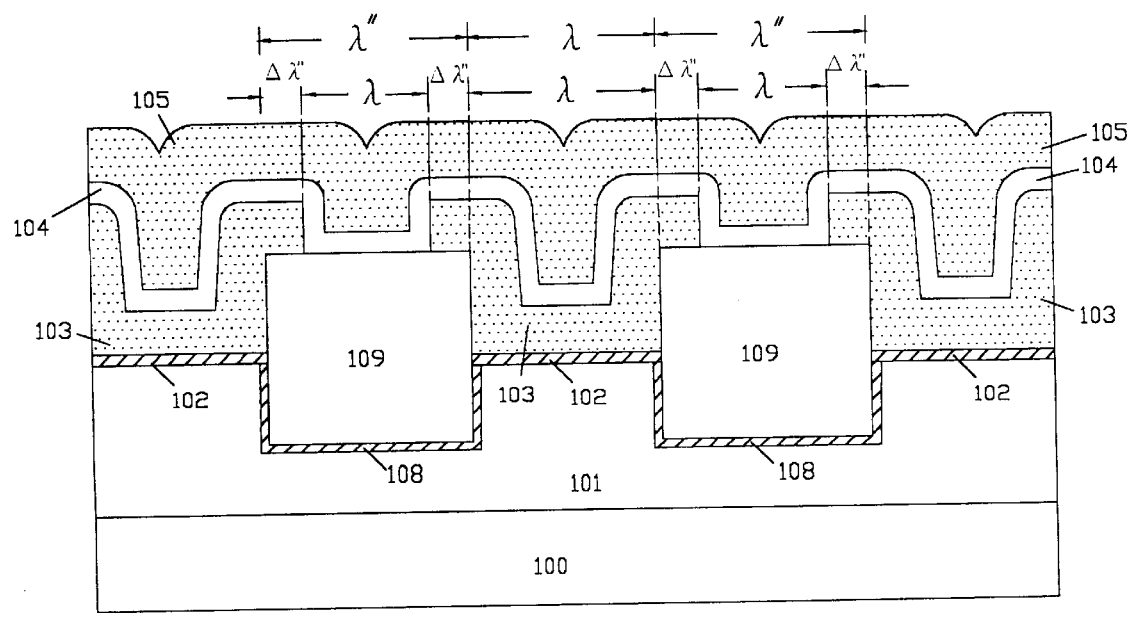
Figure 1C:
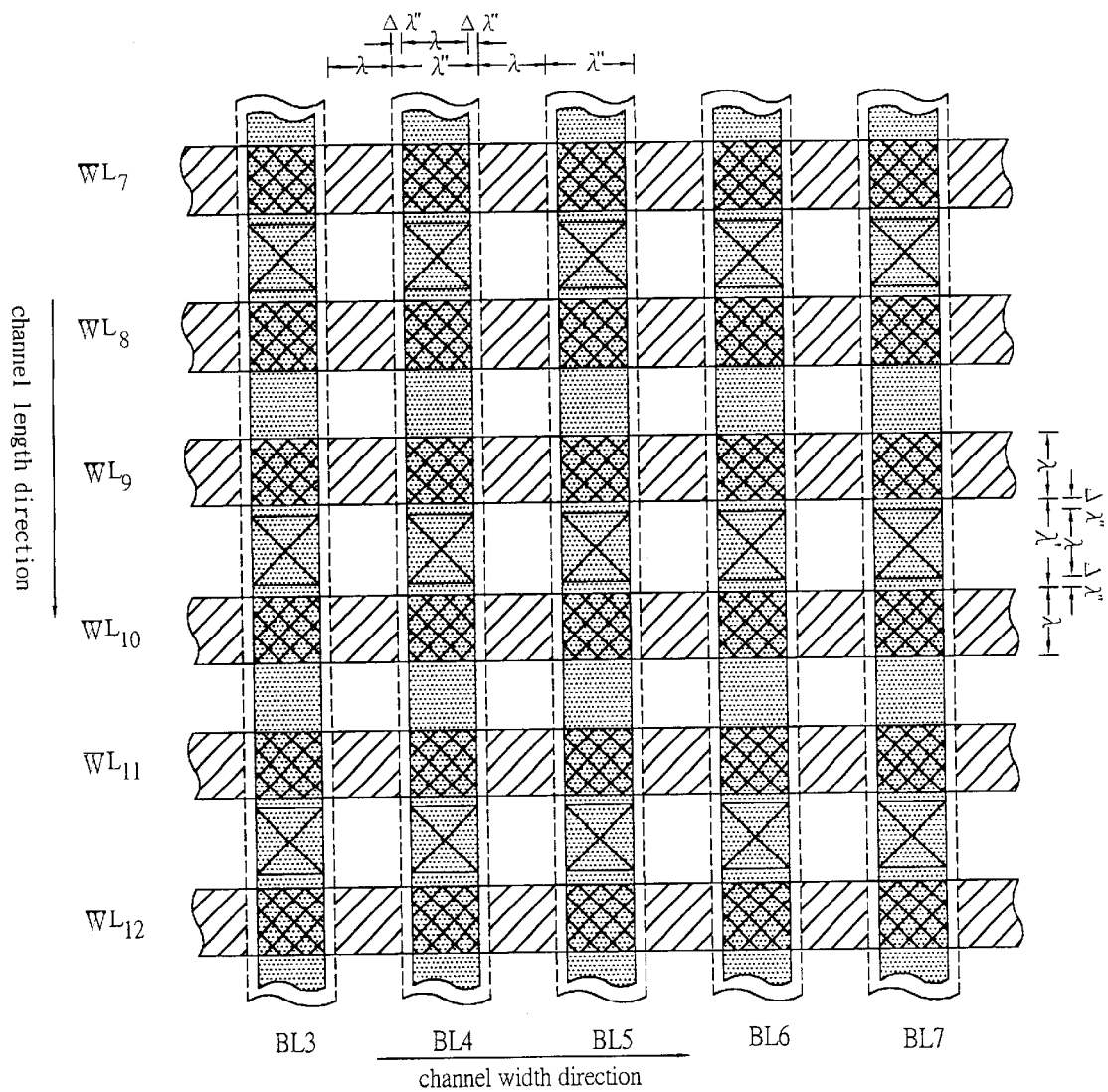
Figure 2A:
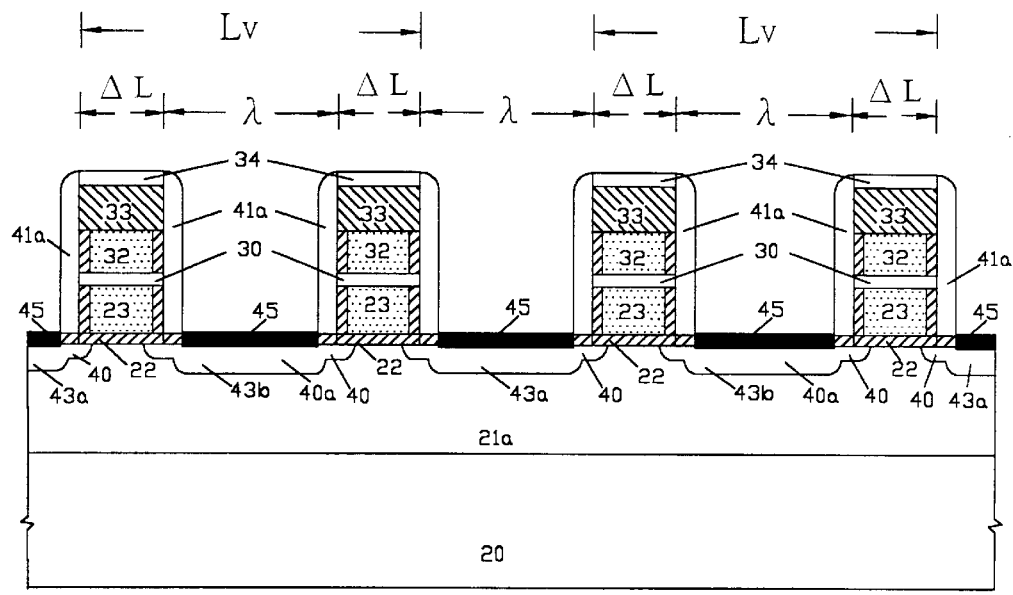
FIGS. 2A through 2C show the partial cross-sectional views of a stacked-gate flash memory device array of the present invention in the channel-length and channel-width directions and the partial top-plan view, respectively.
Figure 2B:
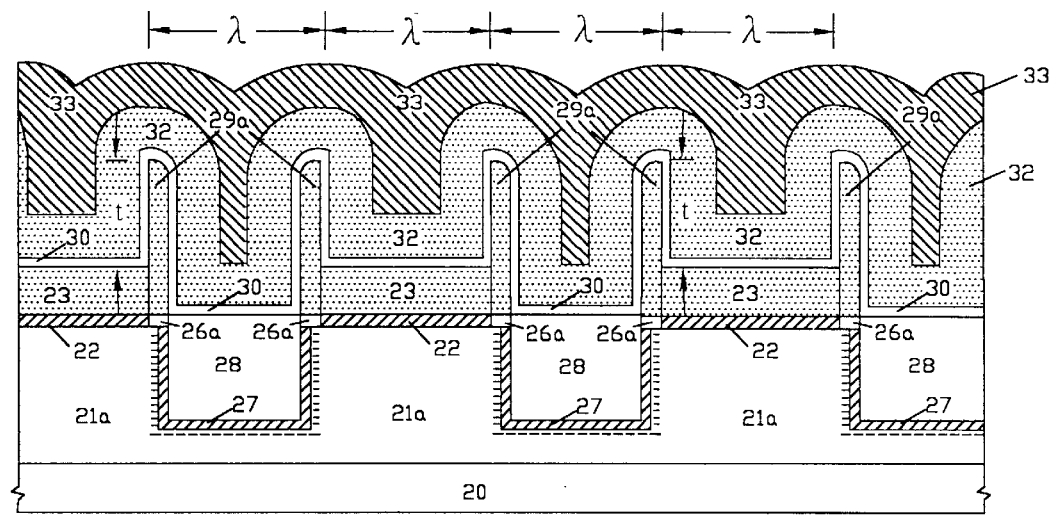
Figure 2C:
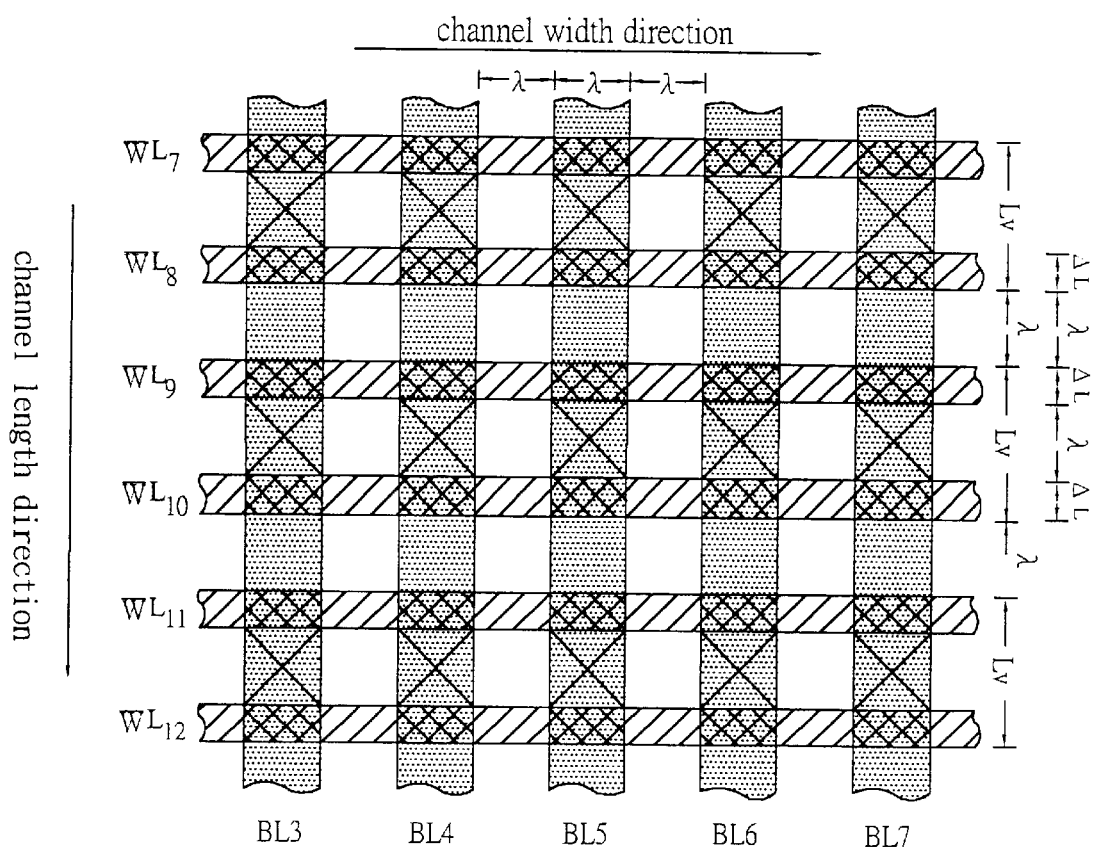

Referring now to FIG. 2A through FIG. 2C, there are shown the advantages of the present invention as compared to FIG. 1A through FIG. 1C of the prior art. FIG. 2A discloses that the spacer technique (not shown) of the present invention is used to define the gate-length ΔL of stacked-gate flash memory devices, and ΔL is much smaller than λ and is adjustable through the spacer width ΔL, where λ is the minimum-feature-size of technology used. Besides, the spacers 41a are used to form self-aligned heavily-doped source/drain diffusion regions 43a and 43b or common-buried source diffusion regions 43c (not shown), self-aligned silicidation 45 of source/drain or common-buried source diffusion regions, and self-aligned contacts. FIG. 2B discloses the self-aligned floating-gate structure of the present invention in the channel-width direction, where the self-aligned floating-gate is consisted of the first polycrystalline-silicon layer 23 and two polycrystalline-silicon spacers 29a formed on the isolation region λ. The surface area of the self-aligned floating gate of the present invention is much larger than that of the prior art shown in FIG. 1B and the trench surface is oxidized and then implanted to form the channel stops without sacrificing the active area. FIG. 2C discloses the partial top-view of a NOR-type stacked-gate flash memory array and it shows that the cell size of the present invention is much smaller than that of the prior art shown in FIG. 1C and the area of the array is also much smaller than that of the prior art shown in FIG. 1C. The detailed fabrication processes and their cross-sectional structures of these special techniques are discussed below.

Referring now to FIG. 3A through FIG. 3D, there is shown a first embodiment of the present invention. The first embodiment of the present invention includes a method of fabricating a shallow-trench-isolation (STI) structure for the channel width of stacked-gate flash memory device array. A first thermal silicon-oxide layer 22 of between about 70 to 110 Angstroms is grown at a temperature of approximately 850° C. in a dry oxygen ambient on isolated retrograde p-wells 21a and 21c and isolated retrograde n-wells 21b formed in a p-type (100) monocrystalline-silicon substrate 20. The retrograde p-wells 21a and 21c and the retrograde n-wells 21b can be isolated by conventional LOCal Oxidation of Silicon (LOCOS) technique or modified LOCOS technique or are isolated by the first embodiment of the present invention. A first polycrystalline-silicon layer 23 of between about 300 to 1500 Angstroms is deposited on the first thermal silicon-oxide layer 22 by low-pressure chemical-vapor-deposition (LPCVD) using silane decomposition at a temperature of between about 580° C. to 650° C. and is in-situ doped with phosphorous (or boron) impurities having a concentration of between about $10^{18}$ to $5\times10^{19}$ Atoms/cm$^3$. A first masking silicon-nitride layer 24 is then deposited by LPCVD using dicholorsilane and ammonia reaction at a temperature of approximately 720° C. and the thickness (t) of the first masking silicon-nitride layer 24 is used to control or adjust the coupling ratio of the floating gate in a flash memory device.

The first masking photoresist 25a is patterned to define the channel width of flash memory device array, as shown in FIG. 3A. The first masking silicon-nitride layer 24, the first polycrystalline-silicon layer 23 and the first thermal silicon-oxide layer 22 are anisotropically etched and the patterned first masking photoresist 25a is stripped. A first conformable silicon-oxide layer 26 having a thickness of between about 200 to 500 Angstroms is deposited by LPCVD using thermal decomposition of tetraethoxysilane at a temperature of between about 750° C. to 850° C., followed by anisotropically etching the first conformable silicon-oxide layer 26 to form the first silicon-oxide spacers 26a on the etched sidewalls, as shown in FIG. 3B. The monocrystalline-silicon in the p-well 21a is then partially etched to a depth of between about 2000 to 4000 Angstroms and the oxidation of the etched monocrystalline-silicon in the p-well 21a is performed at a temperature of approximately 850° C. in a dry oxygen ambient to eliminate the etching-induced defects. The thickness of the second thermal silicon-oxide layer 27 grown on the etched monocrystalline-silicon in the p-well 21a is between about 50 to 150 Angstroms. The implant of boron impurities is performed to form the channel stops for shallow-trench-isolation using rotated large-angle-tilt implantation. It is clearly visualized that the first silicon-oxide spacers 26a are used as the buffer-oxide spacers for implanting the channel stops of shallow-trench-isolation and preventing the edges of first thermal silicon-oxide layer 22 from oxidation. The oxidized trenches are refilled with a thick conformable silicon-oxide film 28 by a high-density plasma CVD (HDPCVD) system using silane or tetraethoxysilane (TEOS) as the silicon source and then the chemical-mechanical-polishing (CMP) is used to planarize the surface by removing the filling silicon-oxides above the first masking silicon-nitride layer 24, as shown in FIG. 3B. The planarized filling silicon-oxide layer 28 is etched by dilute hydrofluoric acid or buffered hydrofluoric acid or anisotropic etching to a depth approximately equal to the thickness t of the first masking silicon-nitride layer 24 plus the thickness of the first polycrystalline-silicon layer 23. A first conformable in-situ doped polycrystalline-silicon layer 29 is deposited by LPCVD using silane decomposition at a temperature of between about 580° C. to 650° C. and the thickness is between about 200 to 500 Angstroms. The first conformable in-situ doped polycrystalline-silicon layer 29 is then anisotropically etched to form the first polycrystalline-silicon spacers 29a on the sidewalls of exposed first masking silicon-nitride layer 24 and first polycrystalline-silicon layer 23. The first masking silicon-nitride layer 24 is then removed by a wet-chemical solution using hot phosphoric acid and a first dielectric layer 30 is then deposited, as shown in FIG. 3C. It should be noted that the first dielectric layer 30 can be a composite layer of silicon oxide-silicon nitride-silicon oxide (ONO) or other composite dielectric layers. It is clearly seen that the coupling ratio of the self-aligned floating gate of the present invention is much increased due to the double-sides area of the formed polycrystalline-silicon spacers 29a.

Using the patterned second masking photoresist 25b to mask all the regions intended to fabricate flash memory devices, the dielectric layer 30 and the first polycrystalline-silicon layer 23 or the first polycrystalline-silicon spacers 29a are removed by using anisotropic dry etching, as shown in FIG. 4A, and then the patterned second masking photoresist 25b is stripped. Using the patterned third masking photoresist 25c (not shown), the implantations of boron impurities across the first thermal silicon-oxide layer 22 into the monocrystalline-silicon regions of p-wells 21c are performed to adjust the threshold-voltage and the punch-through voltage of all n-channel MOS devices in peripheral CMOS devices and the patterned third masking photoresist 25c is then stripped. Similarly, using the patterned fourth masking photoresist 24d (not shown), the implantations of boron or phosphorous impurities across the first thermal silicon-oxide layer 22 into the monocrystalline-silicon regions of n-wells 21b are performed to adjust the threshold-voltage and the punch-through voltage of all p-channel MOS devices in peripheral CMOS devices and the patterned fourth masking photoresist 25d is then removed.

Oxidizing the first thermal silicon-oxide layer in a dry oxygen ambient at a temperature between about 850° C. to 1050° C., the third thermal silicon-oxide layer 31 grown on the monocrystalline-silicon regions in n-wells 21b and p-wells 21c for fabricating peripheral CMOS devices is between about 200 to 400 Angstroms in thickness, as shown in FIG. 4B. Note that the third thermal silicon-oxide layer 31 is mainly used as a gate insulator for peripheral CMOS devices. A second in-situ doped polycrystalline-silicon layer 32 is deposited by LPCVD using silane decomposition at a temperature of between about 580° C. to 650° C. and the thickness is between about 1000 to 2000 Angstroms, followed by depositing a silicide layer 33 having a thickness of between about 1000 to 2000 Angstroms using sputtering or LPCVD, as shown in FIG. 3D for the channel-width direction and FIG. 4C for the channel-length direction.

Figure 4D:
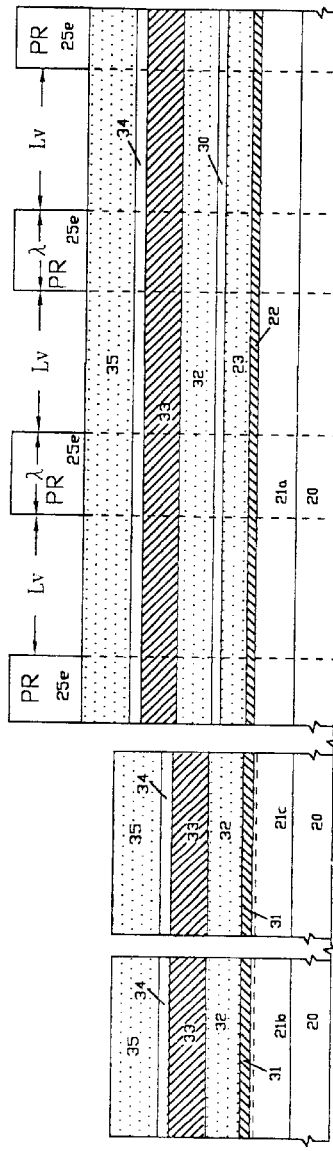
Figure 4E:
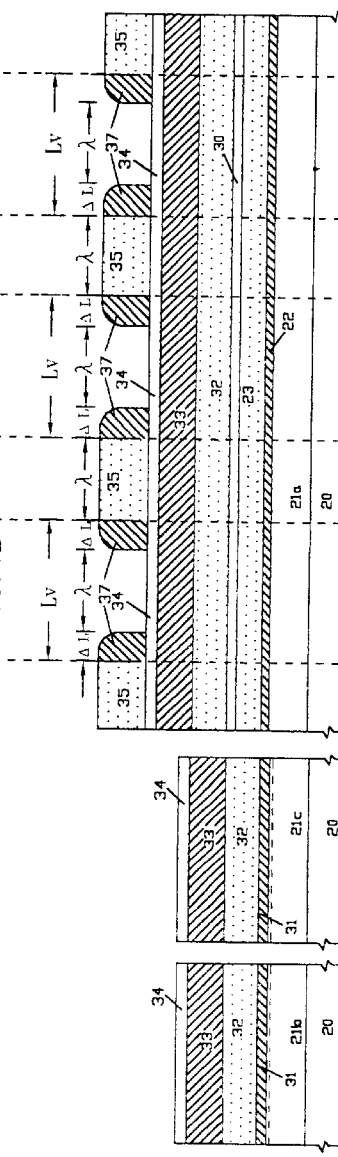

A second masking silicon-nitride layer 34 having a thickness of between about 500 to 1000 Angstroms is deposited using LPCVD. A first masking polycrystalline-silicon layer 35 is then deposited by LPCVD using silane decomposition at a temperature of between about 580° C. to 650° C. and the thickness is between about 1000 to 2000 Angstroms. The first masking polycrystalline-silicon layer 35 is etched using the patterned fifth masking photoresist 25e to define the virtual gate length Lv of stacked-gate flash memory array, as shown in FIG. 4D, where λ is the minimum feature size of technology used and ΔL is the gate length of a stacked-gate flash memory device. After stripping the patterned fifth masking photoresist 25e, a second conformable silicon-oxide layer 36 having a thickness of ΔL is deposited by LPCVD using tetraethoxysilane decomposition at a temperature of between about 700° C. to 850° C., followed by anisotropically etching the second conformable silicon-oxide layer 36 to form the second silicon-oxide spacers 37 on the sidewalls of the etched first masking polycrystalline-silicon layer 35, as shown in FIG. 4E, and the first masking polycrystalline-silicon layer 35 is then removed by anisotropic dry etching, as shown in FIG. 4F.

Figure 4F:
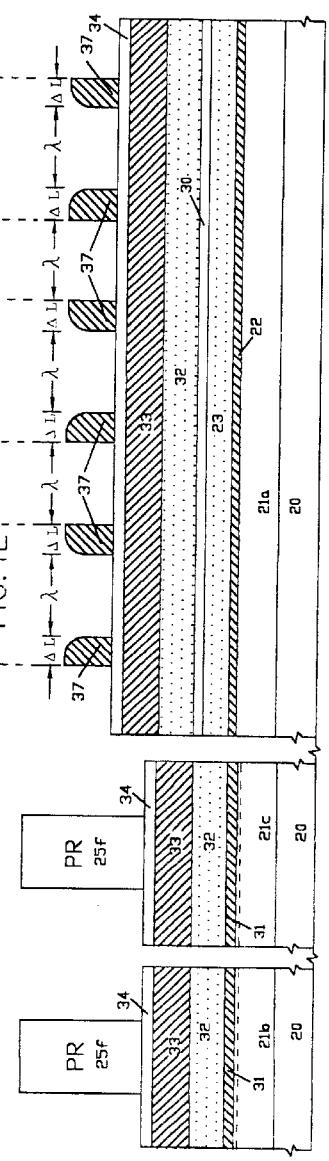

Using the patterned sixth masking photoresist 25f to define the gate lengths of n-and p-channel MOS devices, as shown in FIG. 4F, the second masking silicon-nitride layer 34 is anisotropically etched and the formed second silicon-oxide spacers 37 are then anisotropically removed, followed by anisotropically etching the silicide layer 33 and the second polycrystalline-silicon layer 32 and then stripping the patterned sixth masking photoresist 25f. The first dielectric layer 30 and the first polycrystalline-silicon layer 23 in flash memory array are anisotropically etched in a self-aligned manner. The oxidation is then performed at about 850° C. in a dry oxygen ambient to grow the thin first poly-oxide layers on the sidewalls of etched first and second polycrystalline-silicon layers and said first polycrystalline-silicon spacers. Using the patterned seventh masking photoresist 25g (not shown), the implant of boron impurities across the third thermal silicon-oxide layer 31 into the monocrystalline-silicon regions in the n-wells 21b to form lightly-doped source and drain diffusion regions 38 is performed in a self-aligned manner for all p-channel MOS devices and then the patterned seventh masking photoresist 25g is stripped. Similarly, using the patterned eighth masking photoresist 25h (not shown), the implant of phosphorous impurities across the third thermal silicon-oxide layer 31 into the monocrystalline-silicon regions in the p-wells 21c to form lightly-doped source and drain diffusion regions 39 is performed in a self-aligned manner for all n-channel MOS devices and then the patterned eighth masking photoresist 25h is stripped. The dose of lightly-doped source and drain implants for peripheral CMOS devices is between about $10^{13}$ to $10^{14}$ Atoms/cm². Using the patterned ninth masking photoresist 25i (not shown), the source and the drain of stacked-gate flash memory devices are implanted with arsenic impurities through the first thermal silicon-oxide layer 22 into the monocrystalline-silicon regions in the p-well 21a to form the mid-doped source/drain diffusion regions 40 and the dose is between about $10^{14}$ to $10^{15}$ Atoms/cm², and then the patterned ninth masking photoresist 25i is stripped, as shown in FIG. 4G.

A first conformable silicon-nitride layer 41 is deposited by LPCVD using silane and ammonia reaction at a temperature of between about 650° C. to 800° C. and the thickness is between about 500 to 1000 Angstroms, followed by anisotropically etching the first conformable silicon-nitride layer 41 to form the first silicon-nitride spacers 41a on the sidewalls of the polycide gates of peripheral CMOS devices and stacked-gate flash memory devices, as shown in FIG. 4H.

For a NOR-type architecture, the common buried-source can be used and a patterned non-critical tenth masking photoresist 25j is used to etch the field-oxide layer 28 and the first thermal silicon-oxide layer 22 in a self-aligned manner, followed by implanting phosphorous impurities to form heavily-doped source and common buried-source diffusion regions 40a, as shown in FIG. 5A, and then the patterned tenth masking photoresist 25j is stripped. The reoxidation of the exposed monocrystalline-silicon surface is performed at a temperature of approximately 850° C. to grow a fourth thermal silicon-oxide layer 44 of between about 50 to 150 Angstroms.

Using the patterned eleventh masking photoresist 25k (not shown), the implant of boron impurities across the third thermal silicon-oxide layer 31 into the monocrystalline-silicon regions 21b in n-wells to form heavily-doped source and drain diffusion regions 42 in a self-aligned manner for all p-channel MOS devices and then the patterned eleventh masking photoresist 25k is stripped. Similarly, using the patterned twelfth masking photoresist 25l (not shown), the implant of arsenic impurities across the third thermal silicon-oxide layer 31 into the monocrystalline-silicon regions 21c in p-wells to form heavily-doped source and drain diffusion regions 43 in a self-aligned manner for all n-channel MOS devices and across the first thermal silicon-oxide layer 22 and fourth thermal silicon-oxide layers 44 into the monocrystalline-silicon regions 21a in the p-well to form heavily-doped drain 43a and source 43b and common buried-source 43c diffusion regions of stacked-gate flash memory device array and then the twelfth masking photoresist 25l is stripped. A thermal cycle is performed to activate the implanted doping impurities and to eliminate the implant-induced defects and the annealing temperature is between about 850° C. to 950° C. in a nitrogen ambient using a furnace or a rapid-thermal annealing system. The finished structure is shown in FIG. 5B.

The third, first and fourth thermal silicon-oxide layers over the heavily-doped source and drain diffusion regions of all peripheral CMOS devices and stacked-gate flash memory devices are removed by dilute hydrofluoric acid or buffered hydrofluoric acid or anisotropic dry etch. The titanium metal film is deposited by sputtering and the thickness is between about 500 to 1000 Angstroms. The rapid thermal annealing at 600° C. is performed in a nitrogen ambient to form the titanium-disilicide ($TiSi_2$) layer 45 over the exposed monocrystalline-silicon surface and the titanium-nitride (TiN) layer 46 over all surfaces, the titanium-nitride layer 46 is selectively removed by a $NH_4OH:H_2O_2:H_2O$ (1:1:5) solution to form the self-aligned titanium silicidation of the source and drain diffusion regions. The completed structure is heated in a furnace in an argon ambient to reduce the resistivity of the titanium-disilicide layers.

A thick dielectric layer 47 such as borophosphosilicate glass (BPSG) is deposited by plasma-enhanced CVD (PECVD) followed by chemical-mechanical-polishing (CMP) to planarize the whole structure surface. Using the patterned thirteenth masking photoresist 25m (not shown), the contact holes are patterned and etched to remove the thick dielectric layer 47 followed by stripping the patterned thirteenth masking photoresist 25m. The reflow of the dielectric layer 47 is performed at 850° C. to round up the corners of the etched dielectric layer 47. A thin titanium-nitride layer 48 of between about 100 to 200 Angstroms is deposited by sputtering or CVD, which is used as a barrier metal layer between the upper metal layer and the lower metal layer connected to the active devices. The tungsten layer 49 acted as the metal plugs is deposited by sputtering or LPCVD using tungsten-fluoride reduction in hydrogen at a temperature of between 250° C. to 500° C. to fill the contact holes. Again, the CMP is applied to planarize the structure surface by removing the tungsten and titanium-nitride layers. The M1 metal layer 50 of between about 5000 to 10000 Angstroms in thickness is deposited by sputtering followed by patterning the M1 metal layer using the patterned fourteenth masking photoresist 25n (not shown) to form the interconnect of semiconductor devices including flash memory devices and then stripping the patterned fourteenth masking photoresist 25n, as shown in FIG. 5C.

Figure 6A:
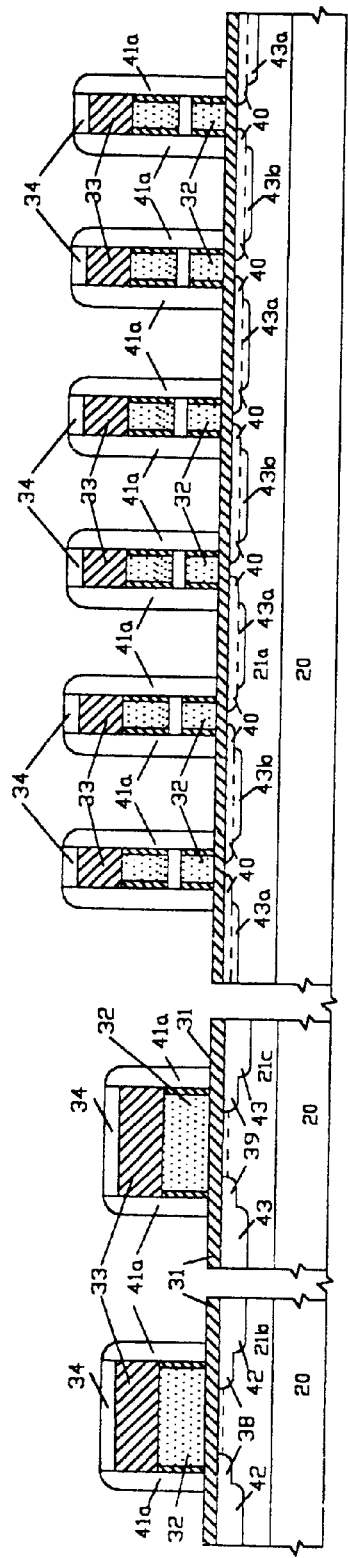
FIGS. 6A through 6B show the schematic cross-section views of the process and structure of the present invention for simultaneously fabricating scalable stacked-gate flash memory device array of a NAND-type architecture and peripheral CMOS devices following FIG. 4.
Figure 6B:
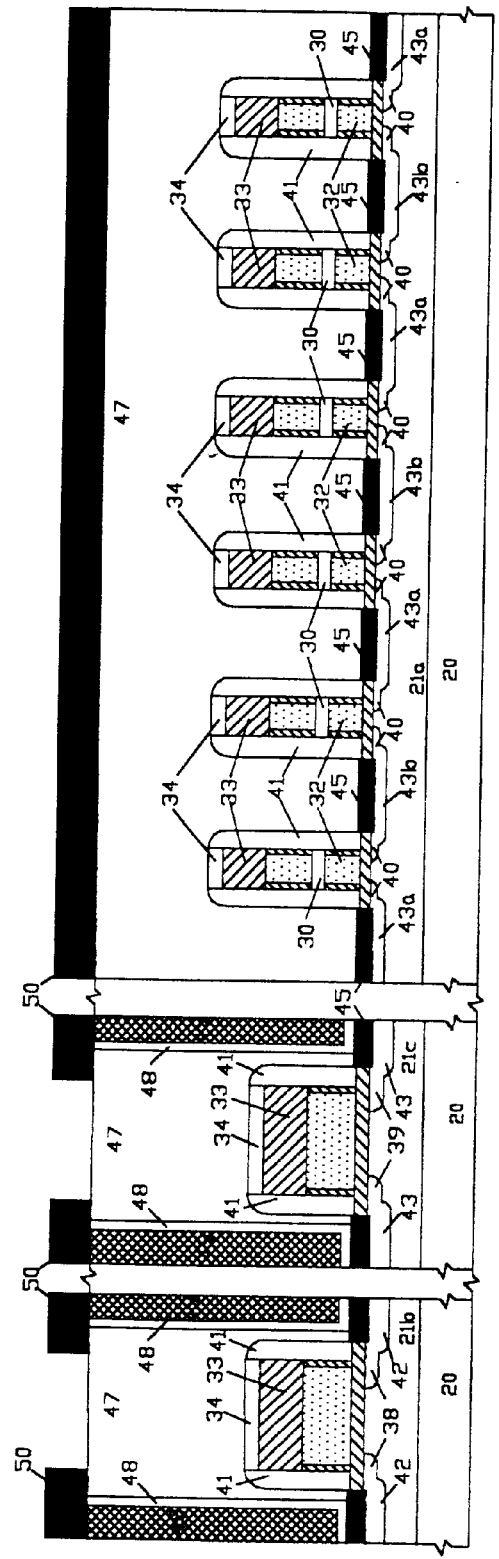

It should be noted that the processes of common buried-source formation including the tenth masking photoresist 25j, field-oxide etch, reoxidation and implantation as described above are removed, then the NAND-type architecture can be easily obtained by internally connecting a series of stacked-gate flash memory devices in series (called a byte), as shown in FIG. 6A and FIG. 6B, followed by connecting the two ends of a series-connected stacked-gate flash memory devices to two separate select MOS devices (not shown).

The second-level M2 interconnect 51 (not shown) can be accomplished by depositing a first intermediate dielectric layer 52 followed by CMP, first VIAS etching using the patterned fifteenth masking photoresist 25o (not shown), stripping the patterned fifteenth masking photoresist 25o, barrier metal and plug metal depositions, CMP, M2 metallization and etching using the patterned sixteenth masking photoresist 25p (not shown) to form M2 metal interconnect, and then stripping the patterned sixteenth masking photoresist 25p. The multilevel interconnect can be obtained by repeating the above processes. At last, the passivation layer 53 is deposited and then the bonding pads are etched by using the patterned seventeen masking photoresist 25q (not shown), and then stripping the patterned seventeen masking photoresist 25q. It should be noted that the titanium metal used in the above description can be replaced by other well-known refractory metals such as cobalt, tantalum and molybdenum etc.; the intermediate dielectric layer can be a CVD silicon-oxide layer or other low dielectric-constant dielectric layer; the interconnect metal can be aluminum or aluminum alloy or copper.

Apparently, the gate length of scalable stacked-gate flash memory device can be made to be much smaller than the minimum feature size of technology used by using the present invention incorporating with a shallow-trench-isolation structure having highly adjustable coupling ratio of the self-aligned floating gate for high density, high-speed, low voltage and low-power mass storage applications.

The embodiments of FIGS. 3 through 6 use a p-type substrate with isolated retrograde n-wells and isolated retrograde p-wells formed. It should be well understood by those skilled in the art that the opposite doping type may also be used. Furthermore, the scalable stacked-gate flash memory devices may also be fabricated in an n-well to form p-channel flash memory devices by taking the advantages of the present invention. Moreover, the scalable stacked-gate flash memory devices have been used to fabricate NOR-type and NAND-type flash memory arrays and other architectures such as DINOR-type and AND-type can be easily formed by using similar processes and device interconnect techniques.

While the invention has been particularly shown and described with reference to the preferred embodiments thereof, it will be understood by those skilled in the art that various changes in form and details may be made without departing from the true spirit and scope of the invention.

What is claimed is:

1. A method of fabricating non-volatile semiconductor memory device array using a shallow-trench-isolation structure for the channel width of non-volatile semiconductor memory devices having highly adjustable coupling ratio for the self-aligned floating gate, said method comprising:

providing a semiconductor substrate;

forming a multilayer structure of a first thermal silicon-oxide layer, a first polycrystalline-silicon layer and a first masking silicon-nitride layer sequentially;

patterning said multilayer structure using a patterned first masking photoresist to define said channel width of said non-volatile semi-conductor memory device array by selectively removing said first masking silicon-nitride layer, said first polycrystalline-silicon layer, said first thermal silicon-oxide layer and then stripping said patterned first masking photoresist;

depositing a first conformable silicon-oxide layer over said patterned multilayer structure followed by anisotropically etching said first conformable silicon-oxide layer to form the first silicon-oxide spacers on the etched sidewalls of said first masking silicon-nitride layer, said first polycrystalline-silicon layer and said first thermal silicon-oxide layer;

etching said semiconductor substrate to form the shallow trenches in a self-aligned manner;

oxidizing the etched trench surface of said semiconductor substrate to form a thin second thermal silicon-oxide layer;

implanting boron impurities into the semiconductor surface of said oxidized shallow trenches to form the channel stops;

depositing a thick conformable silicon-oxide film over said oxidized multilayer structure to fill said shallow trenches;

planarizing the structure surface using chemical-mechanical-polishing (CMP) to remove the filled excess silicon-oxides over said first masking silicon-nitride layer;

etching said planarized filling silicon-oxide layers and said first silicon-oxide spacers in a self-aligned manner to a depth of d, wherein d is approximately equal the thickness t of said first masking silicon-nitride layer plus the thickness of said first polycrystalline-silicon layer;

depositing a first conformable polycrystalline-silicon layer followed by anisotropically etching said first conformable polycrystalline-silicon layer to form the first polycrystalline-silicon spacers on the exposed sidewalls of said first masking silicon-nitride layer and first polycrystalline-silicon layer;

removing said first masking silicon-nitride layer using a wet-chemical solution of hot phosphoric acid or anisotropic etching;

depositing a first dielectric layer over said first polycrystalline-silicon layers, said first polycrystalline-silicon spacers and said etched planarized filling silicon-oxide layers; and implanting phosphorous (or boron) impurities across said first dielectric layer into said first polycrystalline-silicon layers and said first polycrystalline-silicon spacers.

2. The method of claim 1, wherein said semiconductor substrate is p-type with isolated retrograde n-wells and isolated retrograde p-wells formed and said non-volatile semiconductor memory device array is fabricated in p-wells or isolated retrograde p-wells.

3. The method of claim 1, wherein said first thermal silicon-oxide layer is acted as a tunneling-oxide layer and is between about 70 to 110 Angstroms in thickness.

4. The method of claim 1, wherein said first polycrystalline-silicon layer is acted as said self-aligned floating gate of said non-volatile semiconductor memory devices and is in-situ doped with phosphorous (or boron) impurities having a concentration of between about $10^{18}$ to $5\times10^{19}$ Atoms/cm$^3$ and is between about 300 to 2000 Angstroms in thickness.

5. The method of claim 1, wherein said first masking silicon-nitride layer is acted as a hard mask for selectively removing said first polycrystalline-silicon layer and said first thermal silicon-oxide layer and its thickness t is also used to adjust the height of said first polycrystalline-silicon spacers.

6. The method of claim 1, wherein the thickness of said first conformable silicon-oxide layer is between about 200 to 500 Angstroms and said first silicon-oxide spacers are used as the buffer layers for forming the channel stops of said shallow-trench-isolation and preventing the edges of said first thermal silicon-oxide layer from oxidation.

7. The method of claim 1, wherein the depth of said shallow trenches in said monocrystalline-silicon is between about 2000 to 4000 Angstroms and said thin second thermal silicon-oxide layer grown on the trench surface of said etched monocrystalline-silicon surface is between about 50 to 150 Angstroms.

8. The method of claim 1, wherein the implant of boron impurities to form said channel stops of said shallow-trench-isolation can be performed by using rotated large-angle-tilt implantation and the dose of said implant is between about $10^{13}$ to $5\times10^{14}$ Atoms/cm$^2$.

9. The method of claim 1, wherein said depth d of said etching of said planarized filling silicon-oxide layer is equal to the thickness of said first masking silicon-nitride layer t plus the thickness of said first polycrystalline-silicon layer and is also used to highly adjust the coupling ratio of said self-aligned floating gate of said non-volatile semiconductor memory devices.

10. The method of claim 1, wherein said first conformable polycrystalline-silicon layer is in-situ doped with phosphorous (or boron) impurities having a concentration of between about $10^{18}$ to $5\times10^{19}$ Atoms/cm$^3$ and its thickness is between about 200 to 500 Angstroms and the width of said first polycrystalline-silicon spacers is determined by the thickness of said first conformable polycrystalline-silicon layer.

11. The method of claim 1, wherein said first dielectric layer can be a composite layer of silicon oxide-silicon nitride-silicon oxide (ONO) or other dielectric layers having an equivalent silicon-oxide thickness of between about 100 to 200 Angstroms.

12. The method of claim 1, wherein the implant dose of phosphorous (or boron) impurities across said first dielectric layer into said first polycrystalline-silicon layer and said first polycrystalline-silicon spacers is between about $10^{14}$ to $5\times10^{15}$ Atoms/cm$^2$.

13. The method of claim 1 and further comprising the fabrication of said non-volatile semiconductor memory device array of any possible device structure by taking advantages of said shallow-trench-isolation structure having said channel stops and said self-aligned floating gate with highly adjustable coupling ratio.

14. The method of claim 1 and further comprising using a patterned second masking photoresist to remove said first dielectric layer and said first polycrystalline -silicon layer over the regions designated to fabricate other semiconductor devices such as peripheral CMOS devices followed by stripping said patterned second masking photoresist.

15. The method of claim 14 and further comprising using the patterned third masking photoresist to selectively implant boron impurities across said first thermal silicon-oxide layer into said monocrystalline-silicon regions of said p-wells to adjust the threshold voltage and the punch-through voltage of all n-channel MOS devices and then stripping said patterned third masking photoresist followed by using the patterned fourth masking photoresist to selectively implant boron or phosphorous impurities across said first thermal silicon-oxide layer into said monocrystalline-silicon regions of said n-wells to adjust the threshold-voltage and the punch-through voltage of all p-channel MOS devices and then stripping said patterned fourth masking photoresist.

16. The method of claim 15 and further comprising oxidizing an exposed portion of said first thermal silicon-oxide layer to form a third thermal silicon-oxide layer.

17. The method of claim 16, wherein said third thermal silicon-oxide layer is used as a gate insulator of said peripheral CMOS devices and its thickness is between about 200 to 400 Angstroms.

18. The method of claim 16 and further comprising the deposition of a second polycrystalline-silicon layer followed by depositing a silicide layer to form the polycide control-gate of said non-volatile semiconductor memory devices and the polycide gate of said peripheral CMOS devices.

19. The method of claim 18, wherein said second polycrystalline-silicon layer is in-situ doped with phosphorous (or boron) impurities having a concentration of between about $10^{18}$ to $5\times10^{19}$ Atoms/cm$^3$ and its thickness is between about 1000 to 2000 Angstroms.

20. The method of claim 18, wherein said silicide layer can be a tungsten-silicide layer or other refractory metal-silicide layer such as titanium-silicide, tantalum-silicide or molybdenum-silicide etc. and its thickness is between about 1000 to 2000 Angstroms.

21. A method of simultaneously fabricating a scalable stacked-gate flash memory device array and peripheral CMOS devices follows the method of claim 18 and further comprising:

forming a multilayer masking structure of a second masking silicon-nitride layer and a first masking polycrystalline-silicon layer sequentially;

patterning said multilayer masking structure using a patterned fifth masking photoresist to define the space of said stacked-gate flash memory devices with the minimum feature size ($\lambda$) of technology used and the virtual gate length (Lv) of said stacked-gate flash memory devices, wherein said virtual gate length (Lv) is equal to two gate-lengths (2$\Delta$L) of said stacked-gate flash memory device and one source or drain diffusion window ($\lambda$), followed by selectively etching said first masking polycrystalline-silicon layer and then stripping said patterned fifth masking photoresist;

depositing a second conformable silicon-oxide layer having a thickness of $\Delta$L followed by anisotropically etching said second conformable silicon-oxide layer to form second silicon-oxide spacers on the sidewalls of said etched first masking polycrystalline-silicon layers, wherein the width of said second silicon-oxide spacer is equal to $\Delta$L which is smaller than said minimum feature size $\lambda$ of said technology used;

removing said etched first masking polycrystalline-silicon layers using anisotropic dry etch to leave said second silicon-oxide spacers as the hard mask of said gate length of said stacked-gate flash memory devices;

patterning said gate lengths of said peripheral CMOS devices using a patterned sixth masking photoresist followed by anisotropically removing said second masking silicon-nitride layer and then removing said first silicon-oxide spacers and stripping said patterned sixth masking photoresist;

etching anisotropically said silicide layer, said second polycrystalline-silicon layer, said first dielectric layer and said first polycrystalline-silicon layer and said first polycrystalline-silicon spacers in a self-aligned manner to form the gate regions of said stacked-gate flash memory devices and said peripheral CMOS devices;

oxidizing the sidewalls of said etched first polycrystalline-silicon layer and said etched second polycrystalline-silicon layer to form first thin poly-oxide layers;

using a patterned seventh masking photoresist and implanting boron impurities to form lightly-doped source and drain diffusion regions of all said p-channel MOS devices in said peripheral CMOS devices and then stripping said patterned seventh masking photoresist followed by using a patterned eighth masking photoresist and implanting phosphorous impurities to form lightly-doped source and drain diffusion regions of all said n-channel MOS devices in said peripheral CMOS devices and then stripping said patterned eighth masking photoresist followed by using a patterned ninth masking photoresist and implanting arsenic impurities to form mid-doped source and drain diffusion regions of said stacked-gate flash memory devices and then stripping said patterned ninth masking photoresist; and depositing a first conformable silicon-nitride layer followed by anisotropically etching said first conformable silicon-nitride layer to form the first silicon-nitride spacers on the sidewalls of said stacked-gate flash memory devices and said peripheral CMOS devices.

22. The method of claim 21, wherein said second masking silicon-nitride layer is between about 500 to 1500 Angstroms in thickness.

23. The method of claim 21, wherein said first masking polycrystalline-silicon layer is between about 500 to 2500 Angstroms in thickness.

24. The method of claim 21, wherein the implant dose of said boron impurities for forming said lightly-doped source and drain diffusion regions of all said p-channel MOS devices is between about $10^{13}$ to $10^{14}$ Atoms/cm$^2$.

25. The method of claim 21, wherein the implant dose of said phosphorous impurities for forming said lightly-doped source and drain diffusion regions of all said n-channel MOS devices is between about $10^{13}$ to $10^{14}$ Atoms/cm$^2$.

26. The method of claim 21, wherein the implant dose of said arsenic impurities for forming said mid-doped source and drain diffusion regions of said stacked-gate flash memory devices is between about $10^{14}$ to $10^{15}$ Atoms/cm$^2$.

27. The method of claim 21, wherein said first conformable silicon-nitride layer is between about 300 to 1000 Angstroms in thickness.

28. A method of fabricating a NOR-type flash memory device array with the common buried-source and said peripheral CMOS devices follows the method of claim 21 and further comprising:

patterning the common buried-source windows using a patterned non-critical tenth masking photoresist followed by removing the field oxide of said shallow-trench-isolation and said first thermal silicon-oxide layer over said mid-doped source diffusion regions of said stacked-gate flash memory devices in a self-aligned manner followed by implanting phosphorous or arsenic impurities to form heavily-doped source and common buried-source diffusion regions and then stripping said patterned tenth masking photoresist;

oxidizing the monocrystalline-silicon surface of said etched common buried-source to form a fourth thermal silicon-oxide layer, wherein said fourth thermal silicon-oxide layer is between about 50 to 150 Angstroms in thickness;

using a patterned eleventh masking photoresist and implanting boron impurities to form heavily-doped source and drain diffusion regions of all said p-channel MOS devices and then stripping said patterned eleventh masking photoresist followed by using a patterned twelfth masking photoresist and implanting arsenic impurities to form heavily-doped source and drain diffusion regions of all said n-channel MOS devices and heavily-doped drain and source/common buried-source diffusion regions of said stacked-gate flash memory device array and then stripping said patterned twelfth masking photoresist, wherein the dose of said implants is between about $10^{15}$ to $5 \times 10^{15}$ Atoms/cm$^2$;

performing a thermal annealing to activate said implanted impurities and to eliminate the implant-induced defects;

removing said first and fourth thermal silicon-oxide layers over said heavily-doped drain and source/common buried-source diffusion regions of said stacked-gate flash memory device array and said third thermal silicon-oxide layers over said heavily-doped source and drain diffusion regions of all said peripheral CMOS devices in a self-aligned manner;

depositing a titanium metal layer over all the structure surface followed by annealing in a nitrogen ambient to form the titanium-disilicide layer over the exposed monocrystalline-silicon surface of said heavily-doped diffusion regions and the titanium-nitride layer over all the structure surface;

removing selectively said titanium-nitride layer using a NH$_4$OH: H$_2$O$_2$: H$_2$O (1:1:5) solution followed by heating in an argon ambient to reduce the resistivity of said titanium-disilicide layers;

depositing a thick dielectric layer followed by chemical-mechanical-polishing (CMP) to planarize all the structure surface, wherein said thick dielectric layer can be a CVD silicon-oxide layer or a borophosphosilicate glass layer;

etching said planarized thick dielectric layer using a patterned thirteenth masking photoresist to form the contact holes followed by stripping said patterned thirteenth masking photoresist and then reflowing said contact holes to round up the corners;

depositing a titanium-nitride layer known as a barrier metal and a tungsten layer known as a plug metal followed by CMP to planarize the whole structure surface by removing said titanium-nitride and said tungsten on the flat surface of said planarized thick dielectric layer;

depositing a M1 metal layer followed by etching said M1 metal layer using a patterned fourteenth masking photoresist to form M1 metal interconnect known as first-level M1 metal interconnect and then stripping said patterned fourteenth masking photoresist, wherein the drains of said stacked-gate flash memory devices in each column are connected by said first-level M1 metal interconnect to form a bit-line and the sources of said stacked-gate flash memory devices are inter-connected by said titanium-silicided common buried-source to the ground line;

depositing a first intermediate dielectric layer over said first-level M1 metal interconnect followed by CMP, first VIAS etching using a patterned fifteenth masking photoresist, stripping said patterned fifteenth masking photoresist, barrier metal deposition and plug metal deposition, CMP, M2 metal layer deposition and etching using a patterned sixteenth masking photoresist to form second-level M2 metal interconnect and then stripping said patterned sixteenth masking photoresist;

repeating the same processes as second-level M2 metal interconnect to form N-level MN metal interconnect, where N is a positive integer of value at least 3, depending on the requirements; and depositing a thick passivation layer followed by etching said thick passivation layer using a patterned seventeenth masking photoresist to open the bonding pads and then stripping said patterned seventeenth masking photoresist.

29. A method of fabricating a NAND-type flash memory device array and peripheral CMOS devices follows the method of claim 21 and further comprising:

using a patterned eighteenth masking photoresist and implanting boron impurities to form heavily-doped source and drain diffusion regions of all said p-channel MOS devices and then stripping said patterned eighteenth masking photoresist followed by using a patterned nineteenth masking photoresist and implanting arsenic impurities to form heavily-doped source and drain diffusion regions of all said n-channel MOS devices and said stacked-gate flash memory devices and then stripping said patterned nineteenth masking photoresist; wherein the dose of said implants is between about $10^{15}$ to $5 \times 10^{15}$ Atoms/cm$^2$;

performing a thermal annealing to activate said implanted impurities and to eliminate the implant-induced defects;

removing said third thermal silicon-oxide layer and said first thermal silicon-oxide layer over said heavily-doped source and drain diffusion regions of said peripheral CMOS devices and said stacked-gate flash memory devices in a self-aligned manner;

depositing a titanium metal layer over all the structure surface followed by annealing in a nitrogen ambient to form the titanium-disilicide layer over the exposed monocrystalline-silicon surface of said heavily-doped diffusion regions and the titanium-nitride layer over all the structure surface;

removing selectively said titanium-nitride layer using a NH$_4$OH:H$_2$O$_2$: H$_2$O (1:1:5) solution followed by heating in an argon ambient to reduce the resistivity of said titanium-disilicide layer;

depositing a thick dielectric layer followed by CMP to planarize all the structure surface, wherein said thick dielectric layer can be a CVD silicon-oxide layer or a borophosphosilicate glass layer;

etching said planarized thick dielectric layer using a patterned twentieth masking photoresist to form the contact holes followed by stripping said patterned twentieth masking photoresist and then reflowing said contact holes to round up the corners;

depositing a titanium-nitride layer known as a barrier metal and a tungsten layer known as a plug metal followed by CMP to planarize the whole structure surface by removing said titanium-nitride layer and said tungsten layer on the flat surface of said planarized thick dielectric layer;

depositing a M1 metal layer followed by etching said M1 metal layer using a patterned twenty-first masking photoresist to form M1 metal interconnect known as first-level M1 metal interconnect and then stripping said patterned twenty-first masking photoresist, wherein a series of said stacked-gate flash memory devices are internally connected by titanium-silicided heavily-doped source/drain diffusion regions to form a series-connected byte and the two ends of a series-connected byte are internally connected to a separate select MOS device and the one end of said select MOS device is connected to the bit-line using said first-level M1 metal interconnect and the other end of said select MOS device is connected to the ground line using said first-level M1;

depositing a first intermediate dielectric layer over said first-level M1 metal interconnect followed by CMP, first VIAS etching using a patterned twenty-second masking photoresist, stripping said patterned twenty-second masking photoresist, barrier metal deposition and plug metal deposition, CMP, M2 metal layer deposition and etching using a patterned twenty-third masking photoresist to form second-level M2 metal interconnect and then stripping said patterned twenty-third masking photoresist;

repeating the same processes as second-level M2 metal interconnect to form N-level MN metal interconnect, where N=3,4,5,6 . . . , depending on the requirements; and depositing a thick passivation layer followed by etching said thick passivation layer using a patterned twenty-fourth masking photoresist to open the bonding pads and then stripping said patterned twenty-fourth masking photoresist.

30. The methods of claim 28 or claim 29, wherein said titanium metal layer can be replaced by other refractory metal layer such as tantalum, cobalt or molybdenum.

31. The methods of claim 28 or claim 29, wherein said MN metal interconnect can be aluminum, aluminum alloy or copper.

32. The methods of claim 28 or claim 29, wherein said intermediate dielectric layer can be a CVD silicon-oxide layer or a low dielectric-constant dielectric layer.

* * * * *